(12) United States Patent
Honda

(10) Patent No.: US 8,200,469 B2
(45) Date of Patent: Jun. 12, 2012

(54) METHOD FOR RECONSTRUCTING STATEMENT, AND COMPUTER SYSTEM HAVING THE FUNCTION THEREFOR

(75) Inventor: Hiroki Honda, Tama (JP)

(73) Assignee: Fuji Xerox Co., Ltd., Tokyo (JP)

( * ) Notice: Subject to any disclaimer, the term of this patent is extended or adjusted under 35 U.S.C. 154(b) by 662 days.

(21) Appl. No.: 12/095,396

(22) PCT Filed: Nov. 30, 2006

(86) PCT No.: PCT/JP2006/323975
§ 371 (c)(1),
(2), (4) Date: Apr. 2, 2009

(87) PCT Pub. No.: WO2007/063957
PCT Pub. Date: Jun. 7, 2007

(65) Prior Publication Data
US 2009/0210211 A1 Aug. 20, 2009

(30) Foreign Application Priority Data
Nov. 30, 2005 (JP) .................................. 2005-344894

(51) Int. Cl.
*G06F 17/50* (2006.01)
*G06F 19/00* (2011.01)
(52) U.S. Cl. ............ 703/14; 703/17; 716/113; 716/114; 716/116
(58) Field of Classification Search .................... 703/14, 703/17, 2; 716/5, 6, 113, 114, 116
See application file for complete search history.

(56) References Cited

U.S. PATENT DOCUMENTS
7,392,170 B1 * 6/2008 McGaughy et al. ............ 703/14
(Continued)

FOREIGN PATENT DOCUMENTS
JP 2000-57203 A 2/2000
(Continued)

OTHER PUBLICATIONS

Akahoshi et al., "Kino Kiaro no Kosoku Simulation Model Seisei Shudo, DA Symposium 98", Information Processing Society of Japan, Jul. 16, 1998, vol. 98, No. 9, pp. 19-24.
(Continued)

*Primary Examiner* — Thai Phan
(74) *Attorney, Agent, or Firm* — Marshall, Gerstein & Borun LLP

(57) ABSTRACT

Provided is a computer system (1) including a storage (2) for storing a netlist (31), and a contents generator (12) for generating a program (32) containing a statement to execute a plurality of operations of an operation portion contained in the netlist (31). The operation portion includes an operation performing logic operations of multiple stages and having a plurality of inputs, and an operation of a previous stage for a plurality of input sources. The contents generator (12) includes an analyzer (14) for analyzing the operation portion from the output stage to the input stage and for judging that the operation of an object to be analyzed is such an operation when the plural inputs are partially determined that at least a portion of other inputs are don't care, and a converter (15) for reconstructing and outputting, if the judgment is YES, the statement to execute the operation of the analysis object into the statement to execute any of the operations of the plural input sources and to bypass the operation of the source of the input of the don't care.

15 Claims, 18 Drawing Sheets

U.S. PATENT DOCUMENTS

| | | | |
|---|---|---|---|
| 7,409,328 B1 * | 8/2008 | McGaughy et al. | 703/14 |
| 7,502,728 B1 * | 3/2009 | Hurlock et al. | 703/23 |
| 7,971,168 B1 * | 6/2011 | Swanson et al. | 716/113 |
| 2008/0122482 A1 | 5/2008 | Sato | |

FOREIGN PATENT DOCUMENTS

| | | |
|---|---|---|
| JP | 2000-82091 | 3/2000 |
| WO | WO 2005/022380 | 10/2005 |

OTHER PUBLICATIONS

International Search Report for PCT/JP2006/323975 mailed Jan. 16, 2007.

International Preliminary Report on Patentability and Written Opinion for PCT/JP2006/323975 issued Jun. 3, 2008.

Charlton C. C. et al., "Mattress: An Integrated Environment for the Design, Analysis and Programming of Digital Systems," Proc. IT 1990 Conf. Southampton, UK, (1990) pp. 241-246.

Charlton C. C. et al., "Lazy Simulation of Digital Logic," Computer-Aided Design, vol. 23, No. 7, (1991) pp. 506-513.

Clifton, Mitchell H., "Comparison of Space Requirements for Short-circuit and Full Evaluation of Boolean Expressions," Proceedings of the Annual Southeast Conference 1998 ACM, (1998) pp. 261-267.

Dunne P. E. et al., "Sequential and Parallel Strategies for the Demand-driven Simulation of Logic Circuits" Microprocessing and Microprogramming 38, Amsterdam, NL, vol. 38, No. 1-5, (1993) pp. 519-525.

European Search Report for PCT/2006/323975, dated Mar. 5, 2010.

* cited by examiner

```
START:
    P = AND(A,B);
    Q = NAND(C,D);
    R = OR(E,F);
    Y = SEL(R,Q,P);
END:
```

```
START:
    R = OR(E,F);
    if (R == 1)  goto SELQ;
SELP:
    P = AND(A,B);
    Y = P;
    goto END;
SELQ:
    Q = NAND(C,D);
    Y = Q;
END:
```

FIG.9

```
schedule(node){
  if(the node is a global input signal){                              // 48
    do nothing;
  }else if(the node is an AND gate){
    use this template;
      <schedule(input#0)>      // 26                                  // 21
      <node>   =   0;  // 27
      if (<input#0> == 0)  goto L_(node);
      <schedule(input#1)>  ⎤
      <node>   =   <input#1>; ⎦  // 29    28
    L_<node>:
  }else if(the node is an OR gate){
    use this template;
      <schedule(input#0)>                                             // 22
      <node>   =   1;
      if (<input#0> == 1)  goto L_(node);
      <schedule(input#1)>
      <node>   =   <input#1>;
    L_<node>:
  }else if(the node is an XOR gate){
    use this template;
      <schedule(input#0)>                                             // 23
      <schedule(input#1)>
      <node>   =   XOR(<input#0>,<input#1>);
  }else if(the node is a NOT gate){
    use this template;
      <schedule(input#0)>                                             // 24
      <node>   =   NOT(<input#0>)
  }else if(the node is a SEL gate){
    use this template;
      <schedule(input#0)>                                             // 25
      if (<input#0> == 1)  goto L1_<node>;
      <schedule(input#2)>
      <node>   =   <input#2>;
      goto L_<node>;
    L1_<node>:
      <schedule(input#1)>
      <node>   =   <input#1>;
    L_<node>:
  }else {
    ...;
  }
}
```

```
    P = 0;
    if (A == 0)  goto L_P;
    P = B;
L_P:
    Y = 1;
    if (P == 1)  goto L_Y;
    Q = 1;
    if (C == 0)  goto L_Q;
    Q = NOT(D);
L_Q:
    Y = Q;
L_Y:
```

FIG.12

```
schedule(node){
   if(the node is an AND gate){                                    -21
      if(both inputs are global input signals){
         use this template;                                        -21a
            <node>  =  AND(<input#0>, <input#1>);
      }else if(input#0 is a global input signal){
         use this template;
            <node>  =  0;
            if (<input#0> == 0) goto L_(node);                     -21b
            <schedule(input#1)>
            <node>  =  <input#1>;
          L_<node>:
      }else if(input#1 is a global input signal){
         use this template;
            <node>  =  0;
            if (<input#1> == 0) goto L_(node);                     -21c
            <schedule(input#0)>
            <node>  =  <input#0>;
          L_<node>:
      }else{
         use this template;
            <schedule(input#0)>
            <node>  =  0;
            if (<input#0> == 0)  goto L_<node>;                    -21d
            <schedule(input#1)>
            <node>  =  <input#1>;
          L_<node>:
      }
   }else {
      ...
   }
}
```

FIG.13

```
schedule(node){                                              48
  if(the node is an AND gate){
    if(both inputs are global input signals){                21
      ...
    }else if(input#0 is a global input signal){
      ...
    }else if(input#1 is a global input signal){
      ...
    }else{
      if(input#0 is more complex than input#1){
        use this template;
            <schedule(input#1)>                              21e
            <node>   =   0;
            if (<input#1> == 0)  goto L_<node>;
            <schedule(input#0)>
            <node>   =   <input#0>;
            L_<node>:
      }else{
        use this template;
            <schedule(input#0)>                              21f
            <node>   =   0;
            if (<input#0> == 0)  goto L_<node>;
            <schedule(input#1)>
            <node>   =   <input#1>;
            L_<node>:
      }
    }
  }else...{
    ...
  }
}
```

```
    Q = 0;
    if (A == 0)   goto L_Q;
    P = XOR(B,C);          ~65
    Q = P;
L_Q:
    Y = 1;
    if (Q == 1)   goto L_Y;
    R = 0;
    if (D == 1)   goto L_R;
    P = XOR(B,C);
    R = NOT(P);            ~65
L_R:
    Y = R;
L_Y:
```

FIG.16

```
calc_all() {
  P = UNDEFINED;
  Q = 0;
  if (A == 0)  goto L_Q;
  if (P == UNDEFINED)  calc_P();
  Q = P;
L_Q:
  Y = 1;
  if (Q == 1)  goto L_Y;
  R = 0;
  if (D == 1)  goto L_R;
  if (P == UNDEFINED)  calc_P();
  R = NOT(P);
L_R:
  Y = R;
L_Y:
} calc_P() {
  P = XOR(B,C);
  return;
}
```

FIG.17

```
schedule_all(){
  use this template;
      calc_all() {                                              ─ 41
        <intermediate_node1> = UNDEFINED;
        <intermediate_node2> = UNDEFINED;
        ...
        <intermediate_nodeN> = UNDEFINED;
        <schedule(the global output node)>
      }
      calc_<intermediate_node1>() {
        <schedule_real(intermediate_node1)>
        return;
      }
      calc_<intermediate_node2>() {
        <schedule_real(intermediate_node2)>
        return;
      }
      ...
      calc_<intermediate_nodeN>() {
        <schedule_real(intermediate_nodeN)>
        return;
      }
} schedule(node){
  if(the node is a branching intermediate signal){
    use this template;
         if (<node> == UNDEFINED)   calc_<node>();
  }else{                                                         42
    schedule_real(node);
  }
}
schedule_real(node){
  if(the node is an AND gate){
    ...
  }else {
    ...
  }
}
```

```
calc_all() {
  P = UNDEFINED;
  Q = 0;
  if (A == 0)  goto L_Q;
  calc_P();
  Q = P;
L_Q:
  Y = 1;
  if (Q == 1)  goto L_Y;
  R = 0;
  if (D == 1)  goto L_R;
  if (P == UNDEFINED)  calc_P();
  R = NOT(P);
L_R:
  Y = R;
L_Y:
} calc_P() {
  P = XOR(B,C);
  return;
}
```

FIG.19

```
calc_all() {
  P_valid = false;
  Q = 0;
  if (A == 0)  goto L_Q;
  if (P_valid == false)  calc P();
  Q = P;
L_Q:
  Y = 1;
  if (Q == 1)  goto L_Y;
  R = 0;
  if (D == 1)  goto L_R;
  if (P_valid == false)  calc P();
  R = NOT(P);
L_R:
  Y = R;
L_Y:
} calc_P() {
  P = XOR(B,C);
  P_valid = true;
  return;
}
```

FIG.20

```
calc_all() {
  P = UNDEFINED;
  Q = 0;
  if (A == 0)  goto L_Q;
  calc_P();
  Q = P;
L_Q:
  Y = 1;
  if (Q == 1)  goto L_Y;
  R = 0;
  if (D == 1)  goto L_R;
  calc_P();
  R = NOT(P);
L_R:
  Y = R;
L_Y:
} calc_P() {
  if (P == UNDEFINED) {
    P = XOR(B,C);
  }
  return;
}
```

FIG.21

```
calc_all() {
   func_P = calc_P;
   Q = 0;
   if (A == 0)   goto L_Q;
   (*func_P)();
   Q = P;
L_Q:
   Y = 1;
   if (Q == 1)   goto L_Y;
   R = 0;
   if (D == 1)   goto L_R;
   (*func_P)();
   R = NOT(P);
L_R:
   Y = R;
L_Y:
} calc_P() {
   P = XOR(B,C);
   func_P = nop;
   return;
} nop() {
   return;
}
```

```
    P = XOR(B,C);
    Q = 0;
    if (A == 0)  goto L_Q;
    Q = P;
L_Q:
    Y = 1;
    if (Q == 1)  goto L_Y;
    R = 0;
    if (D == 1)  goto L_R;
    R = NOT(P);
L_R:
    Y = R;
L_Y:
```

```
    P = XOR(B,C);
    Q = AND(A,P);
    Y = 1;
    if (Q == 1)  goto L_Y;
    R = NOR(P,D);
    Y = R;
L_Y:
```

FIG.24

```
schedule_all(){
  use this template;
        <schedule_real(intermediate_node1)>  /–43
        <schedule_real(intermediate_node2)>
        ...
        <schedule_real(intermediate_nodeN)>
        <schedule(the global output node)>
} schedule(node){
  if(the node is a branching intermediate signal){
    do nothing;
  }else{
    schedule_real(node);
  }
} schedule_real(node){
  if(the node is an AND gate){
    ...
  }else…{
    ...
  }
}
```

```
schedule_all(){
  use this template;                               45
        <schedule_real(intermediate_node1)>
        <schedule_real(intermediate_node2)>
        ...
        <schedule_real(intermediate_nodeN)>
        <schedule(global_output_node1)>
        <schedule(global_output_node2)>
        ...
        <schedule(global_output_nodeM)>
} schedule(node){
  if(the node is a branching intermediate signal){
    do nothing;
  }else{
    schedule_real(node);
  }
} schedule_real(node){
  if(the node is an AND gate){
    ...
  }else…{
    ...
  }
}
```

48

METHOD FOR RECONSTRUCTING STATEMENT, AND COMPUTER SYSTEM HAVING THE FUNCTION THEREFOR

TECHNICAL FIELD

The present invention relates to a method and a computer system for reconstructing a statement included in a procedure including program and/or hardware control information.

BACKGROUND ART

There are many cases where a procedure from data input to operation result output is defined by multi-stage logics (logical operations). The multi-stage logical operation is described from operation of an input stage to operation of an output stage at a coding step with lapse of time from inputting to outputting of data or information. In addition, typically, the multi-stage logical operation is executed according to the description with lapse of time. An example of the multi-stage logical operation is one implemented as a logic circuit in an LSI and the like. Most of the logic circuit is constructed by a multi-stage combination of operation elements which are various kinds of gate circuits such as AND gates, OR gate and the like.

In the multi-stage logic circuit, a subsequent (rear stage) operation element performs an operation with an output of a plurality of previous stage operation elements as an input. A typical hardware for implementing the multi-stage logic circuit has hardware resources sufficient to construct a circuit in which the plurality of previous stage operation elements operates in parallel, for example, logical operation elements (gate elements, operation elements, etc.) and wirings. Accordingly, an operation order of the plurality of previous stage operation elements causes no problem. However, when a multi-stage logic circuit is implemented in a hardware having insufficient hardware resources or when a multi-stage logical operation is sequentially executed by a program, an operation order at a previous stage may affect an operation speed.

An example of sequential execution of the multi-stage logic circuit by a program is a simulation for verification of LSI functionality upon designing an LSI. As an LSI simulation method, there has been known an event-driven scheme and a cycle base scheme. The even-driven scheme is a scheme of tracing change of a signal value and its effect along a time axis. The cycle base scheme is a scheme of linearly evaluating the entire logics of a circuit one time per one clock cycle. Accordingly, all operation constructing multi-stage logics of the circuit is basically required to be evaluated at one clock cycle.

The cycle base scheme has to evaluate the entire logics every clock cycle. On this account, it may seem as if it is slower than the even-driven scheme at first glance. However, since the cycle base scheme does not require a management of insertion/deletion in/from an event list, it may be faster than the event-driven scheme in actual simulation. In particular, in case of simulation of recent pipeline-oriented LSI having a high activity rate (i.e., active in signal change), the cycle base scheme to evaluate the entire logics uniformly is faster than the even-driven scheme to trace a signal change one by one.

Speedup of simulation becomes more and more important with an increase in the LSI design scale. Japanese Patent Application Publication No. 2000-57203 discloses a method of transforming a simulation format of a cycle base scheme into a format to accelerate the simulation by eliminating a gate to reduce the number of literals or representing a large gate in a factorization format, with the meaning (operation order) of a given netlist unchanged. Japanese Patent Application Publication No. 2000-82091 discloses a method of performing a function simulation fast by extracting a function unit according to function circuit information, calculating execution frequencies of respective functions of function units, and generating a simulation model for a function circuit from the function circuit information by making use of the execution frequencies of respective functions.

With the increase of LSI design scale, there is a demand to further increase a simulation speed. The more time taken for simulation leads to prolongation of an LSI design schedule. On the other hand, if the amount of simulation is reduced in order to reduce the design schedule, it may cause a problem such that a defect reveals after completion of LSI manufacture. In addition, when a multi-stage logical operation is executed in a system such as a computer operating by a program, it is important to be able to shorten execution time.

DISCLOSURE OF THE INVENTION

One aspect of the present invention is directed to a provision of a computer system including a storage for storing a first procedure. The first procedure includes an operation portion for performing a logical operation of a multi-stage including an input stage and an output stage, and the operation portion includes an operation having a plurality of inputs and an operation of a previous stage as sources of the plurality of inputs.

The computer system further includes a means for generating a second procedure. The second procedure includes a plurality of statements for executing a plurality of operations included in the operation portion of the first procedure. The means (scheduling function) for generating the second procedure includes a means for analyzing the operation portion stored in the storage from the output stage to the input stage. The analyzing means may further determine whether or not an operation to be analyzed is an operation of a type (first type) in which, as some of the plurality of inputs of the operation to be analyzed are determined, at least some of other inputs become don't cares.

The means for generating the second procedure further includes an outputting means for reconstructing and outputting a statement for executing the operation to be analyzed into at least one statement if the operation to be analyzed is the first type of operation. The at least one statement includes a statement for executing one of operation of sources (generating sources) of the plurality of inputs of the operation to be analyzed, that is, one of a plurality of operations of a previous stage and for bypassing an operation of a source (generating sources) of an input which becomes don't care by the above-mentioned executing, that is, one of the operations of the previous stage.

Typically, the outputting means reconstructs the statement for executing the operation to be analyzed into a plurality of statements including the following four statements:

(1) a first statement for executing an operation of a source of a first input which is one of the plurality of inputs of the operation to be analyzed;

(2) a second statement for setting an output of the operation to be analyzed;

(3) a third statement for executing an operation of a source of an input which becomes a don't care by the first input; and (4) a fourth statement for bypassing the operation of the source of the input when the input becomes don't care by the first input. The fourth statement is typically a statement for bypassing the third statement when a don't care input is generated by the first input. These statements are not necessarily described in order.

One type of the first procedure is a gate-level netlist, which is a description of a logic circuit including a multi-stage logical operation or its logical combination. One type of the second procedure is a computer program (hereinafter simply referred to as a program), and a plurality of statements includes a plurality of instructions for controlling a computer hardware. Another type of the second procedure is hardware control information for reconstructing a reconfigurable logic circuit, and a plurality of statements includes configuration information for reconfiguring at least some portion of the logic circuit in unit of cycle. Another type of the first procedure may be such a program or such hardware control information.

In the specification, the phrase "an input becomes don't care" or "an input which becomes don't care is generated" indicates that, although a value of a don't care input of an operation ("first type of operation" in the specification) is not determined, an output of the operation is determined. For example, in case of a two-input AND gate, when one input (for example, "first input" in the specification) is "0" (negative or false), an output of the AND gate becomes "0" although the other input is not determined. In this case, the other input is an "input which becomes don't care (don't care input)". This may be equally applied to a multi-stage AND gate. In case of a two-input OR gate, when one input (first input) is "1" (positive or true), an output of the OR gate becomes "1" although the other input is not determined. Also in this case, the other input is an "input which becomes don't care". This may be equally applied to a multi-stage OR gate. In case of a two-input selector, when a select signal (first input) is determined, one input, which is not selected by the select signal, becomes "a don't care input".

An operation which becomes a source (generating sources) of a don't care input is not required to be executed in order to obtain a result of an operation portion to which an output of the operation is transmitted as an input thereof. In the computer system provided by one aspect of the present invention, when the means for generating the second procedure generates a procedure including a statement to execute an operation, the analyzing means analyzes an operation included in the operation portion of the first procedure from the output stage side to the input stage side. By such analysis of operation from the output stage side to the input stage side, an operation of a type (first type) in which an input becomes a don't care can be determined, thereby making it possible to determine whether or not an operation of a previous stage for an operation to be analyzed is executed (evaluated).

If the operation to be analyzed is of the first type in which some of its inputs become a don't care, the outputting means reconstructs a statement to execute the operation into the first to fourth statements to be outputted to the storage. When an input becomes don't care, the procedure including the reconstructed statements becomes a procedure to bypass execution of an operation of a source of the input which becomes don't care.

The means for generating the second procedure further includes recursive (repetitive) processing. That is, the means for generating the second procedure further includes recursively reconstructing the operation included in the reconstructed statement outputted to the storage by the analyzing means and the outputting means likewise. Accordingly, when there occurs a don't care input in an operation included in the operation portion of the first procedure, the means for generating the second procedure can generate the second procedure including a portion represented by a plurality of statements (statement group) scheduled to bypass execution (evaluation) of an operation of a source of the don't care input.

If the operation to be analyzed is a selective operation implemented as a selector or the like, the second statement is a statement to execute the operation to be analyzed by an input, which does not become a don't care, and set its output. This statement may be a statement to refer to or use a look-up table (LUT). In case of a logical operation to output 0/1 (positive/negative or true/false) of AND, OR and the like, the second statement becomes a statement to set a simple prescribed value to an output.

Preferably, the computer system further includes a storage for storing a template. The template includes information (indication) for reconstructing a statement for executing every kind of operation, some of whose inputs become don't cares, into the first to fourth statements or at least one statement including actions involved. The template may be stored in the same storage as the first procedure or a different storage. In addition, the template may be embedded into a program to control the computer system. The outputting means may reconstruct the statement for executing the operation to be analyzed by referring to the template.

Preferably, the outputting means further includes reconstructing the statement for executing the operation to be analyzed when increase of an execution speed of the operation portion is expected by reconstructing the statement for executing the operation to be analyzed. If there is little chance to bypass although the fourth statement to bypass an operation is generated, the second procedure may be delayed by the amount of execution of the statement to bypass. In addition, if an operation to bypass is a process such as setting an immediate variable or a global variable, a process speed is little affected even without bypassing. On the other hand, if a process requires several clocks, such as in an access to a memory, the bypass is meaningful.

It is preferable that the outputting means is able to prevent an overlapped output of a statement for executing the same operation. If a plurality of operations included in the operation portion use an output of an operation of a certain previous stage as a common input, there is a possibility that a plurality of statements for executing an operation of a source of the common input are generated. In case where several clocks are required to execute the operation of the source of the common input, it is possible to reduce time taken to execute the second procedure by a simulator or the like by generating the second procedure in such a manner that statements to execute the operation are not overlapped.

One type of the computer system is a compiler for generating a second contents including the second procedure from a first contents including the first procedure. The second contents includes program and/or hardware control information. Another type of the computer system is a simulator for executing the second contents.

An example of the simulator is a system for generating and executing a model for performing a simulation in a cycle base scheme. One type of such a computer system includes a means for generating a gate-level netlist of a logic circuit and a means for generating a program including the second procedure generated based on the first procedure included in the netlist, and the means for generating the program includes a means for generating the second procedure. One example of the program is a simulation program, and the computer system preferably includes a function as the simulator for executing the simulation program.

Another aspect of the present invention is to provide a program (program product) implemented in a computer having a storage for storing the first procedure. This program includes allowing the computer to function as the means for generating the above-mentioned second procedure. The program (program product) may be provided by being recorded in a suitable computer-readable recording medium such as HDD, CD-ROM and the like. In addition, the program may be provided via a computer network such as Internet and the like.

Still another aspect of the present invention is a method which is implemented in a computer having a storage and includes generating the second procedure from the first procedure. The generating the second procedure includes the steps of:

(a) analyzing the operation portion stored in the storage from the output stage to the input stage and determining whether or not an operation to be analyzed is a first type of operation in which, as some of the plurality of inputs of the operation to be analyzed are determined, at least some of other inputs become don't cares; and (b) reconstructing and outputting a statement for executing the operation to be analyzed into at least one statement if the operation to be analyzed is the first type of operation. The at least one statement includes a statement for executing one of operation of sources of the plurality of inputs of the operation to be analyzed and for bypassing an operation of a source of an input which becomes don't care by the above-mentioned executing.

In the step (b), the typical statement that is reconstructed and outputted (at least one statement) includes the aforementioned first to fourth statements. This method is a method of creating (generating) contents including the at least one reconstructed statement.

Preferably, the generating the second procedure includes repeating (recursively processing) the step (a) and the step (b). In this case, in the step (b), the reconstructed statement is outputted to the storage to be analyzed.

Preferably, the step (b) includes referring to a template including information (indication) to be developed in a statement for executing every kind of operation, some of whose inputs become don't cares, into the afore-mentioned at least one statement.

Preferably, the step (b) includes reconstructing the statement for executing the operation to be analyzed when increase of an execution speed of the operation portion is expected by reconstructing the statement for executing the operation to be analyzed.

Preferably, the step (b) includes preventing overlapped generation of a statement for executing the same operation.

This method may be applied to a simulation method of a logic circuit. Preferably, this method further includes the steps of: generating a gate-level netlist including the first procedure from a description of the logic circuit, generating a simulation program including the second procedure, and simulating the logic circuit in a cycle base scheme by the simulation program.

BRIEF DESCRIPTION OF THE DRAWINGS

FIG. 9 is a view showing an example of a template.

FIG. 12 is a view showing another example of the template.

FIG. 13 is a view showing still another example of the template.

FIG. 16 is a view showing another example of the simulation program corresponding to the logic circuit shown in FIG. 14.

FIG. 17 is a view showing still another example of the template.

FIG. 18 is a view showing still another example of the simulation program corresponding to the logic circuit shown in FIG. 14.

FIG. 19 is a view showing still another example of the simulation program corresponding to the logic circuit shown in FIG. 14.

FIG. 20 is a view showing still another example of the simulation program corresponding to the logic circuit shown in FIG. 14.

FIG. 21 is a view showing still another example of the simulation program corresponding to the logic circuit shown in FIG. 14.

FIG. 24 is a view showing still another example of the template.

FIG. 25 is a view showing still another example of the template.

BEST MODE FOR CARRYING OUT THE INVENTION

Figure 1:
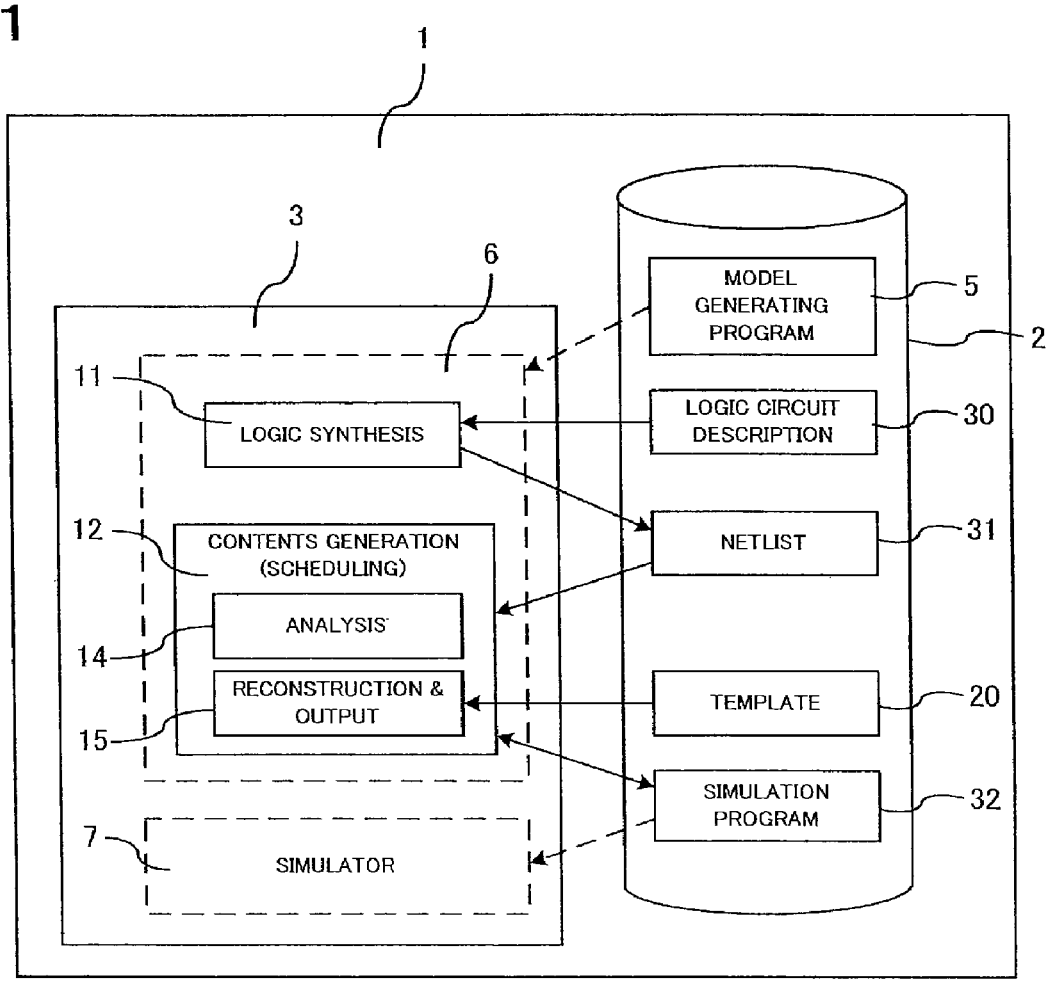
FIG. 1 is a view showing a general configuration of a computer system for generating a simulation model (program).

FIG. 1 shows a general configuration of a computer system that generates a model for simulating a logic circuit in a cycle base scheme. A computer system 1 includes a storage 2, which is typically comprised of a hard disk, and a processing function unit 3 constructed by suitable resources including a CPU and a memory. When a model generating program 5 stored in the storage 2 is loaded into the processing function unit 3, various functions required for a model generating system (compiler) 6 are provided. The model generating system 6 includes a logic synthesis function module 11 as means for generating a gate-level netlist 31 from a description 30 of a logic circuit by RTL or the like, and a contents generator (generator) 12 as means for determining an evaluation order (evaluation schedule) of the gate-level netlist (first contents) 31 and generating a program 32 for simulation (simulation program) as a model (second contents). Instead of the model generating program 5, when the simulation program 32 is loaded into the processing function unit 3, the computer system 1 also functions as a simulator 7 for performing the simulation in the cycle base scheme.

The generator 12 includes a function of recursively analyzing and scheduling an operation (logical operation), which corresponds to each gate of a multi-stage combination logic portion (logical operation portion) and is included in the netlist 31, from an output stage to an input stage. Specifically, the generator 12 includes means (analyzer) 14 for analyzing the multi-stage logical operation included in the netlist 31 from the output stage to the input stage and means (converter) 15 for converting and reconstructing the logical operation into an instruction (statement) included in the simulation program 32.

The analyzer 14 determines whether or not an operation to be analyzed of operations corresponding to gates of the netlist 31 is an operation of a type (first type) to generate an input signal which becomes don't care. When the operation to be analyzed is of the first type, the converter 15 reconstructs an instruction (statement) to execute the operation into a plurality of instructions (plurality of statements) as follows. In addition, operation execution in the simulation program is to evaluate the operation in the simulation, and an operation result or an operation output is a result of the evaluation of the simulation.

1. First instruction (first statement) to select a proper input signal (first input signal) and execute (evaluate) an operation at a previous stage corresponding to a gate of a source of the signal.

2. Second instruction (second statement) to set an output (evaluation result) of the operation to be analyzed.

3. Third instruction (third statement) to execute (evaluate) the operation at the previous stage corresponding to a gate of a source of an input signal becoming don't care (don't care input signal) by the first input signal.

4. Fourth instruction (fourth statement) to skip the third instruction by the first input signal.

The analyzer 14 and the converter 15 repeat the same process for operations, which are included in the first and third instructions or, in some cases, included in the second instruction, as operations to be analyzed, until the operations reach the input stage. These first to fourth instructions are not required to be executed in order. The fourth instruction is a conditional branch instruction, and the first instruction may be incorporated into the conditions of the fourth instruction. In particular, when an operation to be evaluated inputs an immediate or global variable, the first instruction is to simply set the variable and thus may be preferably incorporated into the conditional branch instruction. In this case, the number of actual statements outputted by the converter 15 is 3. The fourth instruction as the conditional branch instruction is required to be executed prior to the third instruction. In addition, the second instruction may be executed either after or before the conditional branch.

In the model generating system 6, the converter 15 including the reconstruction function generates the first to fourth instructions corresponding to the operations to be analyzed by referring to a suitable template selected from a template group 20 stored in the storage 2 along with the netlist 31 and so on. During the generation of the model (simulation program) 32, it is preferable to temporarily store the template group 20 in a storage included in the processing function unit 3, such as RAM or the like, to which the CPU can make access at a high speed, in order to increase an access speed. With the template group 20 separated from the program 5, a template processing pattern can be changed by addition/deletion of a template file.

The template group 20 may be embedded into the model generating program 5 stored in the storage 2. When the template group 20 or statements to perform a process corresponding to the template group are embedded into the program 5, since there is no need to read distinct template group 20 in each case, it is easy to prepare the program 5.

When the simulation program 32 including a sequence of instructions generated by the generator 12 is executed, execution of an operation portion is progressed from an input stage to an output stage. However, if an output value of a gate is determined by only evaluating a value of an input signal of an operation corresponding to the gate, an execution instruction of an operation at a previous stage for calculating values of remaining don't care input signals is skipped (short circuit evaluation). On this account, with the simulation program 32, the simulator 7 does not execute the entire gates at each clock cycle, and thus can increase a simulation process speed. Accordingly, by making the cycle base function simulation fast, it is possible to cope with increase of simulation load accompanying increase of LSI design scale.

Figure 2:
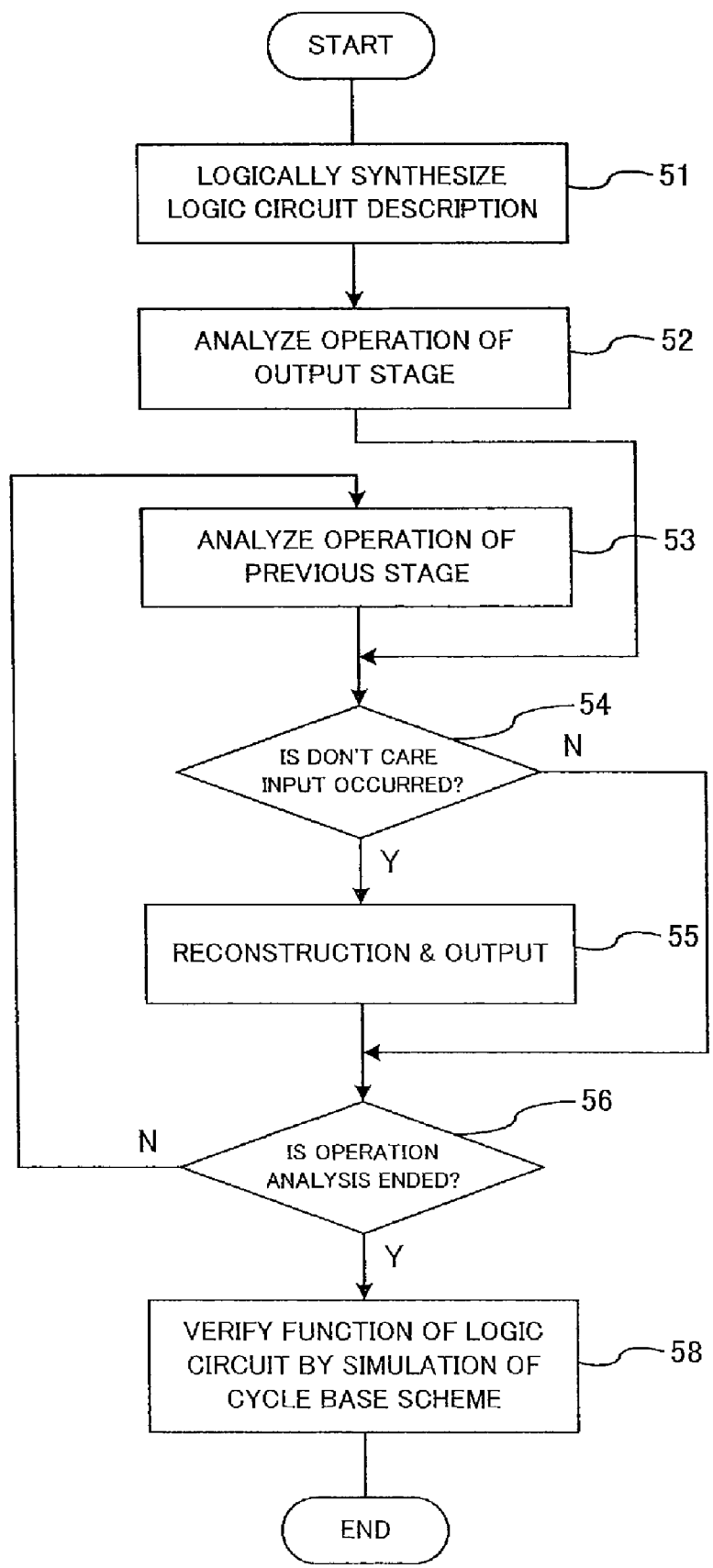
FIG. 2 is a flow chart showing an outline of a process of generating a simulation program.

FIG. 2 shows an outline of a process of first generating all or some of the netlist 31 as a first procedure and then generating all or some of the simulation program 32 as a second procedure from the first procedure in the computer system 1. In addition, the flow chart of FIG. 2 includes a process until a simulation is performed by the simulation program 32. At Step 51, the logic synthesis function module 11 logically synthesizes the logic circuit description 30 to generate the gate-level netlist 31. Next, with the program generator 12 as means for generating the second procedure, at Steps 52 to 56, the simulation program 32 including a sequence of instructions for executing a multi-stage operation portion included in the netlist 31 is generated. Therefore, Steps 52 to 56 become processes of generating the second procedure included in the simulation program 32 from the first procedure with the netlist 31 as the first procedure.

In the process of generating the second procedure, first, at Step 52, the analyzer 14 analyzes an operation of an output stage of an operation portion. At Step 54, if the operation is an operation generating an input of don't care (input becoming don't care), at Step 55, the converter 15 reconstructs an instruction to execute an operation to be analyzed into the first to fourth instructions and outputs these instructions as an instruction (statement) of a second contents (provisional program) to the storage 2. Next, at Step 53, with an instruction of a previously outputted program as the first procedure, an operation included in the reconstructed instruction (operation at a previous stage) is recursively analyzed from an output stage to an input stage. If the operation at the previous stage is of a type to generate an input of don't care, an instruction to execute the operation is likewise reconstructed. Next, at Step 56, the above process is repeated until the analysis of the operation included in the operation portion is ended.

In the reconstruction process of Step 55, it is preferable that the instruction to execute the operation of the same previous stage is not generated in a duplicated manner. With an integrating function, a process speed may be further increased by integrating instructions to execute the same operation after the reconstruction is ended.

When the program 32 as the simulation model of the logic circuit is generated, a simulation is performed using the program 32 at Step 58.

Figure 3:
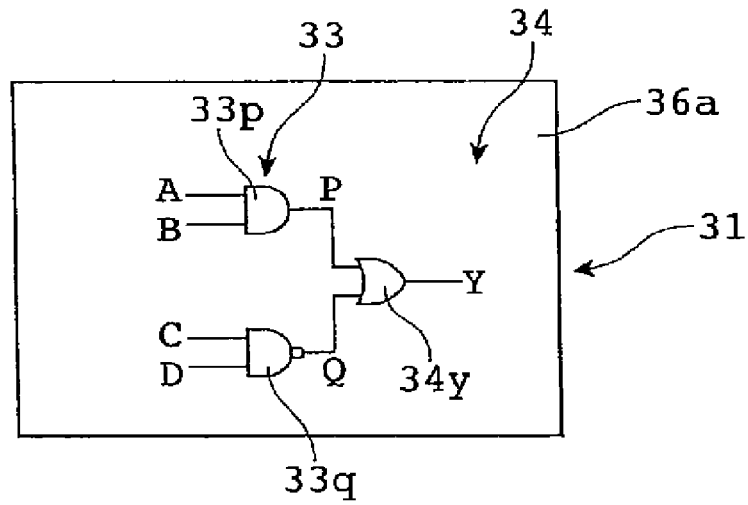
FIG. 3 is a view showing an example of a logic circuit.

In FIG. 3, a configuration of a logic portion included in the gate-level netlist 31 is represented by a gate circuit. A netlist, a program list and so on, which are shown below, are only examples for the purpose of description.

An operation portion 36a included in the netlist 31 is a two-stage combined logic operation. Accordingly, it corresponds to the first procedure stored in the storage 2. The logical operation portion 36a includes operations 33p and 33q of an input stage 33 and an operation 34y of an output stage 34. The operation 33p of the input stage performs a logical (AND) operation with a signal A and a signal B as its inputs and outputs a signal P. The operation 33q of the input stage performs a logical (NAND) operation with a signal C and a signal D as its inputs and outputs a signal Q. The operation 34y of the output stage performs a logical (OR) operation with the signal P and the signal Q as its inputs and outputs a signal Y. The signal Y becomes an output of the operation portion 36a. In the operation portion 36a, the operation of the input stage 33 is an operation of a previous stage (preceding stage) with respect to the operation of the output stage 34, and the operation of the output stage 34 is an operation of a next stage (latter stage or subsequent stage) with respect to the operation of the input stage 33.

Figure 4:
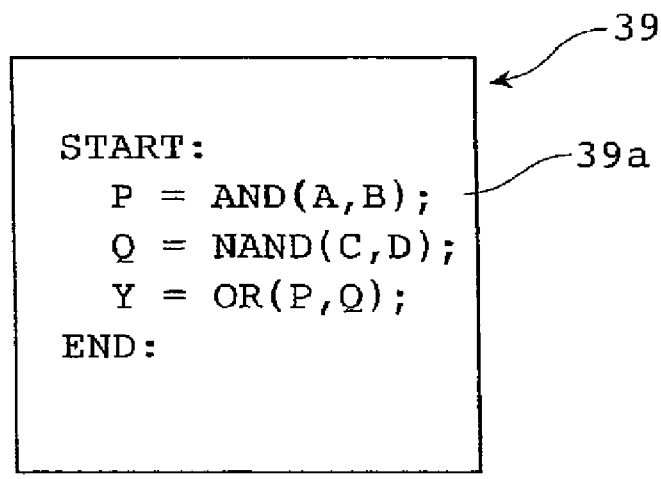
FIG. 4 is a view showing an example of a simulation program of the logic circuit shown in FIG. 3.

FIG. 4 shows an example of a simulation program obtained by compiling the operation portion 36a using a cycle base simulator different from that of FIG. 1. This simulation program 39 is treated as a comparative example in the following description. However, it is apparent that a system, a program, a method, etc. having a function of outputting a program shown as the comparative example are not intended to be not included in the claims of the present application. In the following embodiments, each of a plurality of instructions (statements) included in a program may be described as a code and a group of codes may be described as a code block. In addition, a logical operation, an operation or a gate corresponding to the logical operation (logic gate) may be described as a node. In addition, in the following embodiments, generating contents, including reconstructing statements, may be described as "scheduling" or "to put into scheduling". Besides, although several words may be described to be replaced with different words in the present specification, these words are provided for the purpose of easier understanding of the present invention included in the present specification and are not intended to limit the claims of the present specification.

Codes 39a of the comparative example is a result obtained when the operation portion 36a is compiled to be executed from the input stage to the output stage. In the simulation of the cycle base scheme, codes of START to END labels of the code block 39a represent a group of instructions (instruction sequence) for simulating an action of a logic circuit for one clock cycle. In the simulation, this instruction sequence is repeatedly executed by the number of the clock cycle. Accordingly, when the simulation is executed by the code block 39a of FIG. 4, instructions corresponding to logical operations of all gates are uniformly executed and evaluated from the input stage 33 to the output stage 34 every clock cycle. That is, in the code block 39a, instructions to execute the operation 33p and the operation 33q of the input stage and the operation 34y of the output stage are respectively described in order from the top and the operations are executed in this order.

Figure 5:
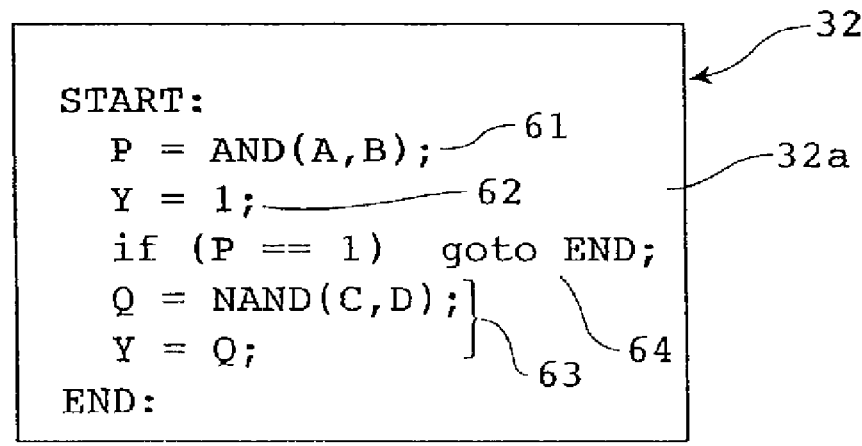
FIG. 5 is a view showing another example of the simulation program corresponding to the logic circuit shown in FIG. 3.

FIG. 5 shows an example of the simulation program 32 obtained by compiling the operation portion 36a using the model generating system 6 of FIG. 1. The analyzer 14 analyzes the operation portion 36a from the output stage 34 to the input stage 33. First, it can be seen that the operation 34y of the output stage is a logic (OR) and is an operation of type 1 to generate an input which becomes don't care. On this account, if one of the input signals P and Q, for example, the signal p, is "1", the output signal Y becomes "1" irrespective of the other input signal Q. Accordingly, the other input signal Q is a don't care input signal. On this account, depending on a value of the input signal P, there is no need to execute the operation (operation of the input stage in this example) 33q of a previous stage, which is a source (generating sources) of the other input signal Q.

In accordance with the flow chart shown in FIG. 2, the analyzer 14 analyzes the operation 34y of the output stage. The converter 15 reconstructs the instruction to execute the operation 34y of the output stage into an instruction sequence including a first instruction 61, a second instruction 62, a third instruction 63 and a fourth instruction 64, as shown in a code block 32a, and outputs the reconstructed instruction sequence to the storage 2. In the code block 32a, the first instruction 61 is an instruction (statement) to execute the operation 33p of a source of the input signal P selected as a first input. The second instruction 62 is an instruction (statement) to set the output signal Y when the input signal Q becomes don't care by the input signal P. The third instruction 63 is an instruction (statement) to execute the operation 33q of the source of the don't care input signal Q. The fourth instruction 64 is an instruction (statement) to bypass the third instruction 63 when the input signal Q becomes a don't care by the input signal P.

The code block 32a is an example of the second procedure and a description is not limited to this. It is possible to take instructions included in the code block 32a as a combined description or a divided description. For example, the instruction 63 may be taken as a description of one instruction to execute the operation 33q and to set a result of the execution to the output Y. The first instruction 61 may be included in a description of a condition of the fourth instruction which is a conditional branch instruction. In addition, the second instruction 62 may be described as an ELSE statement of the fourth instruction.

When the code block 32a shown in FIG. 5 is executed by the simulator 7, an operation is executed and evaluated generally from the input stage 33 to the output stage 34. However, if a value of the signal P is "1", since a value of the signal Q becomes don't care, the computation of the operation 33q is skipped. When the circuit has this degree of scale, execution of a statement of the conditional branch of the fourth instruction 64 becomes overhead. On this account, an execution speed of the code block 32a is insignificantly different from an execution speed of the code block 39a. Rather, the execution speed of the code block 32a may be slower than that of the code block 39a. However, if the operation 33q is not a simple NAND gate and performs a multi-stage complicated logical operation, execution of the multi-stage operation may be entirely skipped. On this account, it is possible to significantly reduce execution time of the code block 32a of a cycle to generate don't care.

Figure 6:
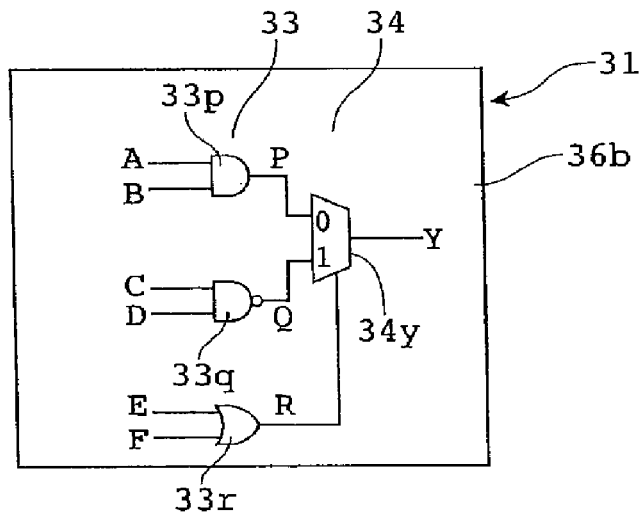
FIG. 6 is a view showing another example of the logic circuit.

FIG. 6 shows a configuration of another operation portion 36b included in the netlist 31. The operation portion 36b is also a two-stage combined logical operation and includes operations 33p, 33q and 33r of the input stage 33 and an operation 34y of the output stage 34. The operations 33p and 33q of the input stage are equal to those shown in FIG. 3. The operation 33r performs a logic (OR) operation with a signal E and a signal F as its inputs and output a signal R. The operation 34y of the output stage is a selector and outputs a signal P or a signal Q as a signal Y using the signal R as a control signal (select signal).

Figure 7:
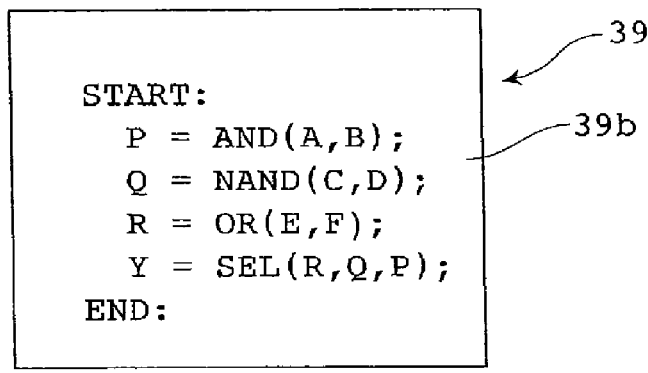
FIG. 7 is a view showing an example of a simulation program of the logic circuit shown in FIG. 6.

FIG. 7 shows a code block 39b of a comparative example, which is obtained by compiling the operation portion 36b to be executed from the input stage to the output stage. In the code block 39b, instructions to execute the operations 33p, 33*q* and 33*r* of the input stage and the operation 34*y* of the output stage are respectively described in order from the top. Accordingly, the code block 39*b* shows that instructions to simulate logical operations of all gates are uniformly executed from the input stage 33 to the output stage 34 for each clock cycle.

Figure 8:
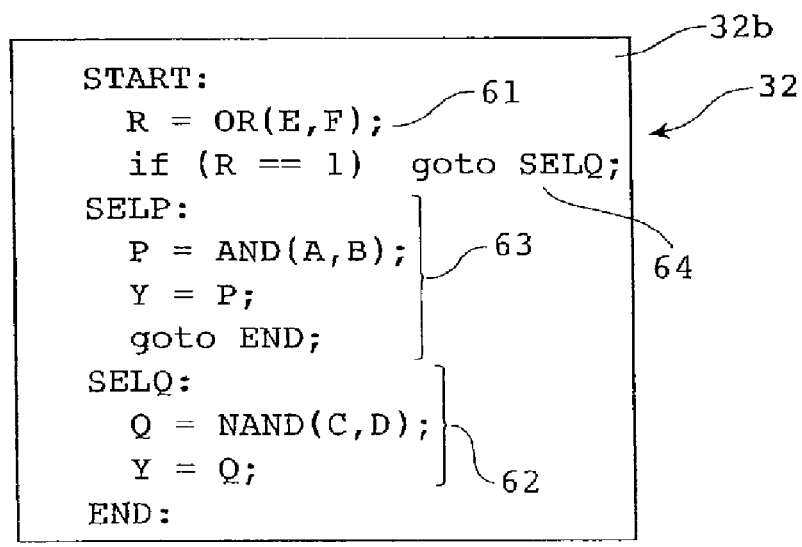
FIG. 8 is a view showing another example of the simulation program corresponding to the logic circuit shown in FIG. 6.

FIG. 8 shows an example of the simulation program 32 obtained by compiling the operation portion 36B using the model generating system 6 of FIG. 1. When the operation portion 36*b* is analyzed from the output stage 34 to the input stage 33, the operation 34*y* of the output stage, which becomes a next stage or subsequent operation with respect to the operation of the input stage is a selector and is an operation of first type to generate an input signal which becomes don't care. That is, in the operation 34*y*, one of the input signals P and Q becomes don't care by the input signal R. On this account, when the input signal R is analyzed as the first input signal, there is no need to execute the operation 33*p* or 33*q* of the input stage (previous stage), which is a source of the input signal P or Q, based on a value of the input signal P.

In accordance with the flow chart shown in FIG. 2, the operation 34*y* of the output stage is first analyzed, and then, the instruction to execute the operation 34*y* of the output stage is reconstructed into an instruction sequence including a first instruction 61, a second instruction 62, a third instruction 63 and a fourth instruction 64, as shown in a code block 32*b*. In the code block 32*b*, the first instruction 61 is an instruction to execute the operation 33*r* of a source of the input signal R selected as a first input. The second instruction 62 is an instruction to set the output signal Y when the input signal P becomes don't care by the input signal R. The second instruction 62 includes an instruction to execute the operation 33*q* and an instruction to set a result of the operation 33*q* to the output Y. The third instruction 63 is an instruction to execute the operation 33*p* of the source of the don't care input signal P. The third instruction 63 includes an instruction to execute the operation 33*p*, an instruction to set a result of the operation 33*p* to the output Y, and an instruction to bypass the second instruction 62. The fourth instruction 64 is an instruction to bypass the third instruction 63 when the input signal P becomes don't care by the input signal R.

When the code block 32*b* shown in FIG. 8 is executed by the simulator 7, the select signal R of the selector 34*y* is first evaluated, and, based on a result of the evaluation, a stage goes back to the input stage with respect to only a generating source of one of the signals P and Q and the generating source is evaluated at the input stage. On this account, it is possible to shorten an execution time of the code block 32*b*.

FIG. 9 shows an example of referring to the template group 20 when the contents generator 12 generates the simulation program 32 as contents. The template group 20 is referred to in Step 55 to reconstruct a statement in the converter 15. FIG. 9 is a partial routine of the model generating program 5 to cause the computer system 1 to function as the model generating system 6, an function of the analyzer 14 and the function of the converter 15 are implemented in the computer system 1. That is, the program source of FIG. 9 shows an example of a routine (scheduling routine) 48 to generates codes using the template group 20. By the routine 48, at Step 52, the generator 12 starts from a node directing a gate of the output stage 34 of the gate-level netlist 31 and recursively generates the codes using a template which is included in the template group 20 and depends on the kind of gate.

If an operation to be analyzed is a two-input AND gate, the converter 15 reconstructs an instruction to execute a logical (AND) operation using a template 21 included in the routine 48. If one of the input signals is "0", the logical (AND) operation (gate or node) outputs "0" and the other input signal becomes don't care. The template 21 includes an indication (information) to generate a first instruction (code) as a statement 26 to execute an operation of a previous stage corresponding to a source of an input signal #0 (input #0). The template 21 also includes an indication to generate a second instruction (code) as a statement 27 to set an output of an operation (node) to be evaluated to "0". The template 21 also includes an indication to generate a fourth instruction (code) as a statement 28 to be a conditional branch for short-circuit evaluation. The template 21 also includes an indication to generate a third instruction (code) as a statement 29 to execute an operation of a previous stage as a source of the other input signal #1 (input #1).

A template 22 included in the template group 20 includes information for reconstructing by the converter 15 an instruction to execute an operation to be evaluated when the operation is a logic (OR). The reconstructed instruction has been already described in the above.

The template 23 is used when an operation to be evaluated is a logic (XOR). This logical operation does not generate an input which becomes don't care. On this account, the template 23 includes an indication to generate an instruction to execute every operation of an input side (previous stage) and an instruction to evaluate a logic (XOR) based on a result of the execution.

The template 24 is for a logic (NOT) operation. This logical operation also does not generate an input which becomes don't care. Accordingly, the template 24 includes an indication to generate an instruction to execute an operation of an input side (previous stage) and an instruction to evaluate a logic (NOT) based on a result of the execution.

The template 25 is used to analyze the selector. The template 25 includes a statement to indicate information to generate from the first instruction 61 to the fourth instruction 64 shown in FIG. 8.

Figures 10, 11:
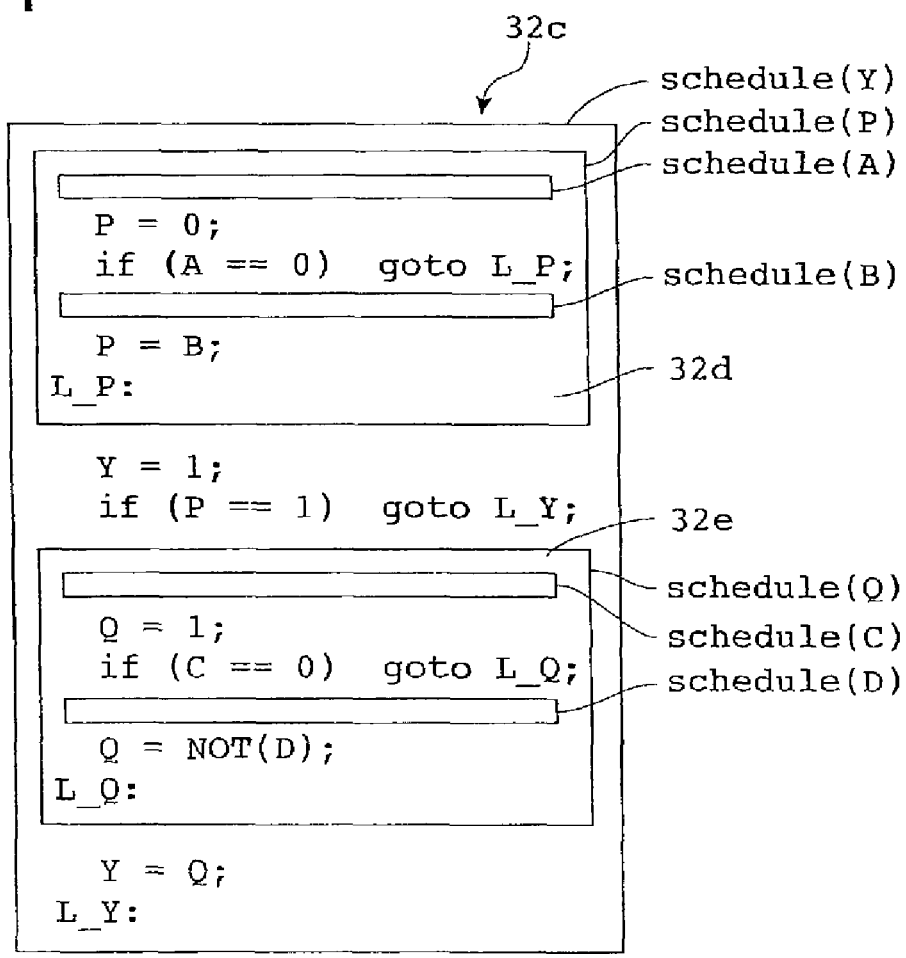
FIG. 10 is a view showing another example of the simulation program corresponding to the logic circuit shown in FIG. 3.
FIG. 11 is a view showing details of generation of the program shown in FIG. 10.

A code block 32*c* shown in FIG. 10 is another example of the code block corresponding to the operation portion 36*a* shown in FIG. 3. The code block 32*c* is an example of a code block that is reconstructed and outputted by the converter 15 according to the routine 48 of FIG. 9.

FIG. 11 shows details of reconstruction of instructions included in the code block 32*c* by the converter 15. The code block 32*c* is a code block scheduled to operate the output signal Y entirely. In the code block 32*c*, a small block 32*d* including a "L_P:" label is a code block scheduled for the signal P, and a small block 32*e* including a "L_Q:" label is a code block scheduled for the signal Q.

First, an instruction to execute the operation 34*y* that constitutes the source of the output signal Y is generated as a schedule (Y). This instruction is for executing the operation 34*y* of a logic (OR). This instruction is reconstructed based on the template 22 included in the routine 48 and converted (reconstructed) into an instruction sequence including an instruction (schedule (P)) to execute the operation 33*p* and an instruction (schedule (Q)) to execute the operation 33*q*. Next, each instruction is recursively analyzed and reconstructed by the routine 48 by referring to the template. Although a template for an NAND gate is not incorporated into the routine 48 of FIG. 9, the template of the NAND gate may be inferred from a template of an AND gate.

In general, the instruction (schedule (P)) and the instruction (schedule (Q)) include instructions to execute an operation of a further previous stage which is a source of an input of an operation as an object of the instruction. The routine 48 recursively analyzes and reconstructs these instructions by referring to an incorporated template. The reconstructed instructions are instructions (schedules (A), (B), (C) and (D)) indicated by thin and long empty blocks in FIG. 11. In the operation portion 36a shown in FIG. 3, the signals A to D are global input signals (input signals for the entire circuit). On this account, since these instructions can not be reconstructed, the routine 48 "do nothing" to them and accordingly does not generate a new code. In this manner, the code block 32c shown in FIG. 10 is generated.

When the simulation program 32 as the model is generated (put into scheduling), an order of analyzing and processing an operation (logic) included in the netlist 31 is different from an order (logic evaluation order) of executing an instruction (code) generated as the simulation program 32. In scheduling, the generator 12 recursively analyzes a multi-stage operation in a depth first search manner from the output stage to the input stage to generate, substitute or reconstruct an instruction. When the simulator 7 executes the code generated as the program 32, the multi-stage operation is executed generally from the input stage to the output stage.

The simulation program 32 generated from the netlist 31 by the generator 12 of this embodiment includes an instruction that does not explicitly show a logic of an operation to be evaluated. As can be seen from the template incorporated into the routine 48, if the operation to be evaluated is of a type to generate an input which becomes don't care, a logic of the operation to be evaluated is not explicitly shown in the program 32. When the input which becomes don't care is generated, not only an operation (operation of previous stage) of a source of the don't care input is not executed, but also execution of an operation (operation to be evaluated (analyzed)) with the don't care input as its input) is unnecessary, and accordingly, a logic requiring the don't care input is not explicitly stated.

For example, as shown in the template 21, if a logic of the operation to be evaluated is AND, an output is simply set to "0" when the input which becomes don't care is generated. When the input which becomes don't care is not generated, the other input is simply set to the output. In addition, as can be seen from the details shown in FIG. 11, as it becomes closer to the output stage, the instruction reconstructed from the operation to be evaluated is dispersed. On this account, it is nearly impossible to infer a logic of the operation to be evaluated from the simulation program 32. Accordingly, it is not ease for a designer to directly code the simulation program 32 generated by the model generating system 6, and he/she is inevitable to use the computer system 1 to generate the simulation program 32.

In the above description, it has been described with reference to FIGS. 3 to 5 and 6 to 8 that the simulation program 32 including the second procedure is generated from the netlist 31 including the first procedure. In these embodiments, the netlist 31 is a first contents including the first procedure, the simulation program 32 is a second contents including the second procedure, and the contents generator 12 can generate the second contents from the first contents. The contents generator 12 of the model generating system 6 may take the program 39 of the comparative example scheduled from the input stage to the output stage, instead of the netlist 31, as a contents including the first procedure, convert (reconstruct) this program 39 using the routine 48 into which the template is incorporated, and generate the program 32 as a contents including the second procedure. In this case, the processing function unit 3 or the computer system 1 including the contents generator 12 may be called an optimization compiler.

In a typical program specifying any specification or application, such as the program 39 of the comparative example, a description to represent lapse of time from the input stage to the output stage is made in a progress direction of a program counter, that is, from the top to the bottom indicating an execution order of statements (time lapse). Accordingly, the optimization compiler analyzes the source program 39 from the bottom to the top, that is, in a reverse temporal direction, and converts the program 39 into the program 32 that does not execute an operation of a source of a don't care input, thereby increasing a process speed of an application given by the source program 39.

In addition, it has been described in the above that a model to simulate a logical circuit implemented in ASIC, FPGA and the like in the cycle base scheme is generated by way of an example. For example, the program 39 shown in FIG. 4 or 7 shows a circuit or device to execute all logical operations (logic gates) for each cycle. In recent years, there has been proposed a hardware to dynamically change or reconfigure a circuit configuration in the unit of cycle, as disclosed in International Publication No. WO/2005/022380 which is owned by the present applicant.

In such a dynamic reconfigurable hardware, other processes (execution methods) are possible if there is no need to strictly seek for a merit achieved by parallel execution of all operations, for example, an execution speed. First, a circuit configuration to execute the statements of the program 39 shown in FIG. 4 or 7, that is, the circuit shown in FIG. 3 or 6, is generated as hardware control information (configuration information) to be implemented in the reconfigurable hardware. Next, the function of the circuit shown in FIG. 3 or 6 is executed in the unit of cycle with small hardware resources achieved by reconstructing some of the circuit configuration.

The contents generator 12 may converts the above hardware control information into hardware control information corresponding to the program 32 shown in FIG. 5 or 8. That is, the contents generator 12 may convert the above hardware control information into hardware control information provided with pass for an implement of the circuit to execute an operation of a source of a don't care input. When the reconfigurable hardware is controlled based on this hardware control information, it is possible to avoid reconfiguring the circuit to execute an operation to generate an input which becomes don't care on a hardware, thereby achieving improvement of a process speed and more effective use of hardware resources.

A template usable for the reconstruction of statements is not limited to that shown in FIG. 9. The code block 32c shown in FIG. 10 is one scheduled by the generator 12 implemented in the system 1 by the routine 48 shown in FIG. 9 (hereinafter simply sometimes referred to as scheduling). The code block 32c shown in FIG. 10 is different from that shown in FIG. 5 or 8 and may not be said to be an efficient code block although it does not perform a wrong operation. Although the code block 32c makes a conditional branch by determining that the signal B or D is a don't care signal depending on a value of the signal A or C to input a global variable, it does not so much contribute to increase of a code execution speed, that is, a simulation execution speed. Rather, the code block 32c may deteriorate the execution speed due to overhead of determination or branch. First of all, in a case where a memory access is made in order to generate the signals A to D or several clocks are consumed for generation of such signals, a conditional branch in the code block 32c is useful to increase of a process speed.

The routine 48 shown in FIG. 12 includes another example of the template 21 to reconstruct an instruction to execute an AND gate operation. This template 21 includes information to determine whether or not an instruction is reconstructed by attribute of an input. In a case where a source of a don't care input is a global input and a simulation execution speed can not be expected (anticipated) to be increased even if the source of the don't care input is bypassed by the fourth instruction, the converter 15 does not reconstruct an instruction by referring to the template 21. In addition, the template 21 is configured to be able to select an operation of a previous stage to bypass as don't care.

The template 21 shown in FIG. 12 includes a portion 21a to indicate no reconstruction if both of the input signals #0 and #1 are global variables, a portion 21b to indicate a reconstruction to bypass an operation of a source of the input signal #1 with the input signal #0 selected as the first input if the input signal #0 is a global variable, a portion 21c to indicate a reconstruction to bypass an operation of a source of the input signal #0 with the input signal #1 selected as the first input if the input signal #1 is a global variable, and a portion 21d to indicate a reconstruction to bypass an operation of a source of the input signal #1 with the input signal #0 selected as the first input by default if neither of the input signals is a global variable. The converter 15 can use this template 21 to generate the codes shown in FIGS. 5 and 8. Also, any template to reconstruct an instruction to execute an operation of other logics may be arranged in this way.

The routine 48 shown in FIG. 13 includes still another example of the template 21. This template 21 includes portions 21e and 21f to indicate a selection of an input to determine occurrence of don't care by determining complexity of an operation of a generating source of an input signal in addition to the above. When an AND gate operation and an OR gate operation are scheduled, it is preferable to consider an evaluation order of the input signal. For example, in the code block 32a shown in FIG. 5, an evaluation (operation of a generating source) of the signal (intermediate signal) Q is skipped depending on an evaluation result of the signal (intermediate signal) P. On the contrary, it is possible to generate codes to skip an evaluation of the signal P depending on an evaluation result of the signal Q.

In the code block 32a shown in FIG. 5, a code execution performance is unchanged in either of the evaluation orders. However, if an operation of a source of the signal P and a logic of an operation group of a further previous stage of the operation of the source are complicated, it is expected that a case where "after computing the simple signal Q, if possible, computation of a complicated operation or operation group to generate the signal P is skipped" is better than a case where "after computing a complicated operation or operation group to generate the signal P, if possible, computation to generate the simple signal Q is skipped". Accordingly, in scheduling, the converter 15 uses the portion 21f to first generate a code for the input signal #0 or the portion 21e to first generate a code for the input signal #1, along with the template 21 of FIG. 13, depending on complexity (number of gates) of a logic to compute the input signals.

However, logic complexity to be determined in scheduling may not be simply estimated by the number of gates. For example, a logic circuit 36n shown in FIG. 6 includes 4 gates in a simple count. However, the code block 32b shown in FIG. 8 is scheduled to bypass an operation of a don't care input. Accordingly, since an operation of a generating source of one of the signals P and Q can be necessarily skipped by executing the code block 32b, code execution time is substantially time corresponding to 3 gates. Accordingly, it can be said that the logic complexity by expression of codes generated by this scheduling corresponds to 3 gates.

In effect, in this embodiment, "scheduling" includes bypassing an operation of a source of a don't care input (operation of a don't care input), and the complexity of a logic contributing to a merit by "bypassing" is "time taken to evaluate the logic" and an expected value of execution time of a code and/or code block (short-circuit evaluation code) to be evaluated for short-circuit. It is difficult to exactly compute this expected value, requiring a long time taken for the computation. Accordingly, it is effective to reflect an object having a relatively obvious expected value on a template. However, it is difficult to exactly compute an expected value for a complicated short-circuit evaluation code. Accordingly, when it is difficult to exactly compute the expected value, it is preferable to use a heuristic method such as designation of a hint from a user and automatic aggregate by a profiler.

In addition, although a degree of complexity of an operation group of a generating source of an input signal of some gate is known, it can not be said that this completely defines good and bad of evaluation order. This is because the good and bad of evaluation order also depends on a probability of skipping an operation of a generating source of a don't care input. A case where a procedure including a logic (OR) to input a complicated intermediate signal P (1 in most cases) and a simple intermediate signal Q (0 in most cases) is simulated may be considered. There may be a scheduling "although a simple intermediate signal Q is first computed, since a value of this signal is 0 in most cases, a complicated intermediate signal P has to be also computed and, in the end, both of the signals P and Q are required to be computed in most cases" and a scheduling "although the intermediate signal P is complicated, since a value of this signal is 1 in most cases in computation, computation of the simple intermediate signal Q can be skipped". In some cases, the latter scheduling may be better than the former scheduling.

Accordingly, in a scheduling to bypass an operation of a don't care input, it is preferable to use a template including an indication to reconstruct (regenerate) codes to achieve an evaluation order to maximize the product (expected value of a skip gain) of the probability of skipping and a skip gain. A method of obtaining the expected value of the skip gain includes a method in which a probability that other signals become a don't care by each intermediate signal is designated by a user and a method in which a skip probability and/or a skip gain are automatically aggregated by a profiler. An aspect of the method of the present invention includes executing a simulation, and generating and/or reconstructing (regenerating) a code by the generator 12 by performing in parallel a simulation execution and a profile aggregation and evaluating short-circuit by dynamically determining an evaluation order.

A viewpoint (index) of "expected value of skip gain" may be utilized in not only comparing evaluation orders but also comparing a short-circuit evaluation by programs generated by a scheduling, for example, the programs 32a and 32b of FIGS. 5 and 8, with a uniformly linear evaluation by the programs 39a and 39b of the comparative examples shown in FIGS. 4 and 7. If there occurs no skip in the short-circuit evaluation, code execution is delayed by a conditional decision code or a conditional branch code as compared to the uniformly linear evaluation. Accordingly, a gain of the short-circuit evaluation has a minus value. If there occurs a skip in the short-circuit evaluation, when a gain of the short-circuit evaluation is compared with a gain of the uniformly linear evaluation, the gain of the short-circuit evaluation is reduced by a conditional decision and conditional branch overhead. Accordingly, depending on the complexity of the intermediate signal, there may be a case where "if a skip probability is not fairly high, an expected value of a gain does not become plus". When such a gate circuit (logic circuit) is simulated, it is preferable to employ a method of evaluating a code uniformly linearly with lapse of time.

For example, the template 21 shown in FIG. 12 includes a portion 21a to indicate "generating a uniformly linear evaluation code only if both of input signals are global input signals" in scheduling. Instead of this portion 21a, it is also effective that the template 21 includes a portion to indicate "generating a uniformly linear evaluation code only if computation logic of both of input signals is extremely simple" in scheduling. Here, the phase "extremely simple" depends on conditions of architecture and so on of a computer used for simulation and preferably includes such conditions. For example, if an input signal to be computed by an order of one gate is regarded as extremely simple, the generator 12 of this embodiment includes generating a code block for the uniformly linear evaluation shown in FIG. 4 for the logic 36a of FIG. 3.

In the above description, an example of the first procedure of a conversion source is the gate-level netlist 31 and the netlist 31 targets a logic circuit composed of only a two-input basic gate or a selector. However, a scheduling method of bypassing a source of a don't care input is not limited to the netlist targeting the logic circuit composed of only the two-input basic gate or the selector, but may be apparently applied to a netlist targeting a logic circuit including an operation element of a multi-input gate and/or a complex gate.

An embodiment related to a logic circuit having an intermediate-stage operation from which an intermediate signal is branched and an embodiment related to a logic circuit having a plurality of global output signals will be additionally described below.

Figures 14, 15:
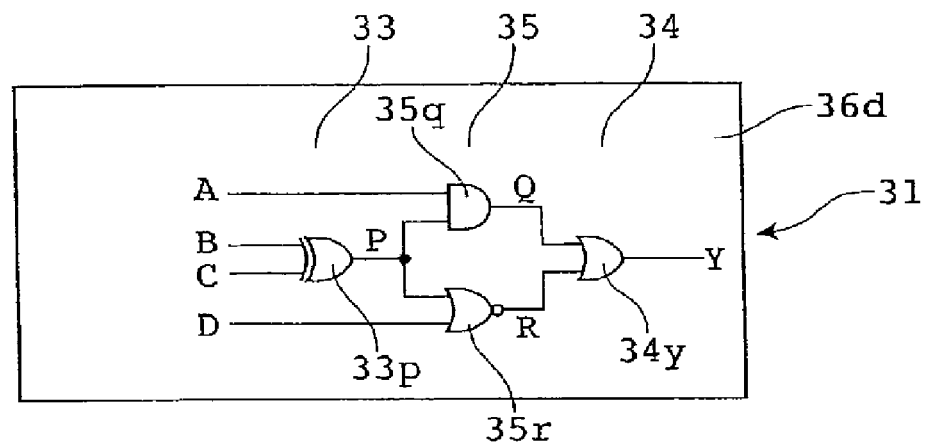
FIG. 14 is a view showing another example of the logic circuit.
FIG. 15 is a view showing an example of a simulation program corresponding to the logic circuit shown in FIG. 14.

In FIG. 14, still another operation portion 36d included in the netlist 31 is represented by a logic circuit. The operation portion 36d is a three-stage combined logic operation including an operation 33p of an input stage 33, operations 35q and 35r of an intermediate stage 35, and an operation 34y of an output stage 34. The operation 33p of the input stage performs a logical (XOR) operation with a signal B and a signal C as its inputs and outputs a signal P. The operation 35q performs a logical (AND) operation with a signal A and a signal P as its inputs and outputs a signal Q. The operation 35r performs a logical (NOR) operation with the signal P and a signal D as its inputs and outputs a signal R. The operation 34y of the output stage performs a logical (OR) operation with the signal Q and the signal R as its inputs and outputs a signal Y.

FIG. 15 shows an example of a code block of the simulation program 32 generated (compiled) by the model generating system 6 shown in FIG. 1 in order to simulate the operation portion 36d. In this code block 32d, for the signal P as an input of both of the operation 35q and the operation 35r, an instruction 65 to execute the operation 33p of a generating source of the signal P is generated in two sites. In this example, the operation 33p is an input stage and the statement 65 to execute the operation 33p is a statement for only execution of one logic (XOR) (XOR gate). Accordingly, even if the same computation is made at the two sites, it has a small effect on an execution speed of the code block 32d. However, there may be a case where the operation 33p is complicated or an operation logic of the operation 33p of a stage previous to the input stage is complicated. In this case, repeated computation of a generating source of the signal P is wasteful in the respect of code amount and code execution time.

Accordingly, it is preferable that the converter 15 of the model generating system 6 shown in FIG. 1 includes preventing an instruction to execute the same operation from being repeatedly generated. However, the instruction to execute the same operation can not be integrated in a simple manner. There is a need to consider a possibility that an instruction to execute one operation is skipped due to short-circuit evaluation.

Now, several examples including preventing repeated execution of the same operation will be described with reference to FIGS. 16 to 24. FIG. 16 shows another example of a code block of the simulation program 32 of the operation portion 36d. In this code block 32e, a code to operate a generating source of the signal P is made independent as a subroutine 66 such that execution of an operation of the source of the intermediate signal P is not overlapped in code amount. In addition, a statement including a decision that "if computation of the signal P has been already completed before a subroutine call, the subroutine call is not made" such that the execution of the operation of the source of the intermediate signal P is not overlapped. In order to make a correct decision, an variable indicating the intermediate signal P is set to be a value "UNDEFINED", which is neither "0" nor "1", as an initialization process A template 41 including a portion indicating generation of the code block 32e is incorporated into a routine 48 shown in FIG. 17. The template 41 indicates that intermediate signals as inputs for a subsequent operation are once set as "UNDEFINED". In addition, the template 41 indicates that an operation as a generating source of the intermediate signals is initially set to make a subroutine call.

The routine 48 shown in FIG. 17 may include templates 21 to 25 to reconstruct an execution instruction of each operation in addition to the template 41. These templates 21 to 25 may be described in a "schedule_real" procedure subsequent to the template 41 of the routine 48. This description may have the same contents as the "schedule" procedure included in the routine shown in FIG. 9 or the like.

In addition, the routine 48 includes a template 42. This template 42 indicates that in a site requiring an instruction code to execute an operation of a generating source of a branching intermediate signal a code that "if UNDEFINED, a subroutine call is made" instead of the instruction code to execute the operation of the generating source is generated. When scheduled using the template 42, since the "schedule" procedure is recursively applied inside the "schedule_real", it is possible to prevent overlapped execution for all operations.

FIG. 18 shows still another example of a code block of the simulation program 32 of the operation portion 36d. For an initial "calc_P subroutine call", since the signal P is necessarily "UNDEFINED", there is no need to make a decision positively. In this code block 32f, for an initial subroutine call, a subroutine call is unconditionally made without making a decision about whether or not the signal P is "UNDEFINED".

FIG. 19 shows still another example of a code block of the simulation program 32 of the operation portion 36d. Instead of treating the input signal P as a three-value variable which is either "0" or "1" or "UNDEFINED", it is possible to provide a flag indicating a computation completion state, and moreover it is possible to treat the input signal P as a two-value variable which is either "0" or "1" in a code block 32g. On this account, the code block 32g is provided with "P_valid" which is "variable indicating whether or not computation is completed", in addition to an variable P indicating an input signal.

FIG. 20 shows still another example of a code block of the simulation program 32 of the operation portion 36d. In this code block 32h, a decision about whether or not computation of an operation of a source of the input signal P is completed is made in an initial calc_P subroutine. A main routine of the code block 32h has a code type that "a calc_P subroutine is called at any rate in a site requiring an operation of the signal P."

FIG. 21 shows still another example of a code block of the simulation program 32 of the operation portion 36d. The code block 32i has a code type that "a calc_P subroutine is indirectly called via a pointer, and after completion of computation, it rewrites the pointer so as to point to a nop subroutine."

Figure 22:
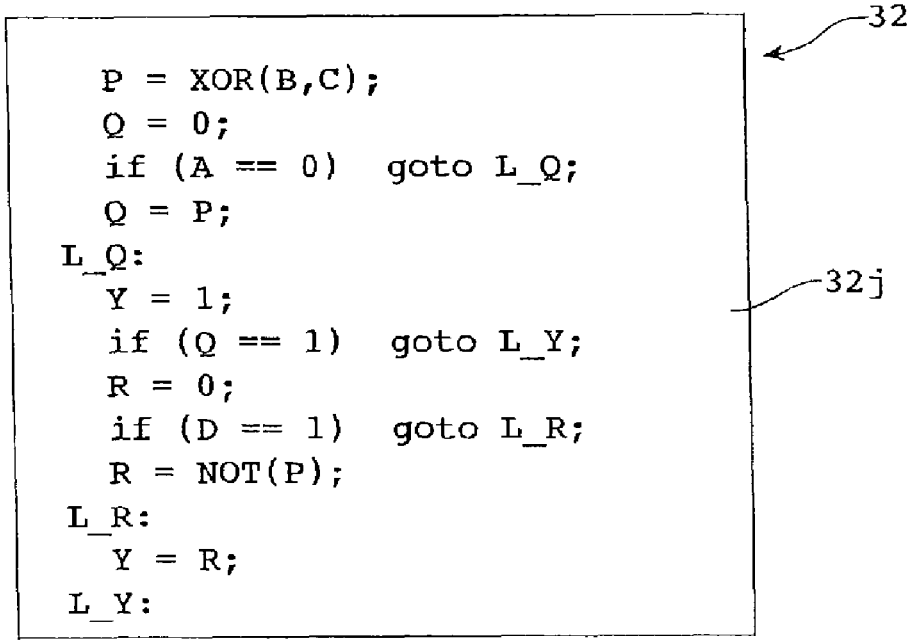
FIG. 22 is a view showing still another example of the simulation program corresponding to the logic circuit shown in FIG. 14.

FIG. 22 shows still another example of a code block of the simulation program 32 of the operation portion 36d. In this code block 32j, an operation of a generating source of the signal P is forcedly executed to obtain a value of the signal P in advance. This code block is suitable for a case where there is low possibility that the signal P becomes a don't care in an operation of all subsequent (next stage) operations in which the signal P becomes an input signal even in short-circuit evaluation and there is low possibility that execution of an operation of a generating source of the signal P is all skipped.

Figure 23:
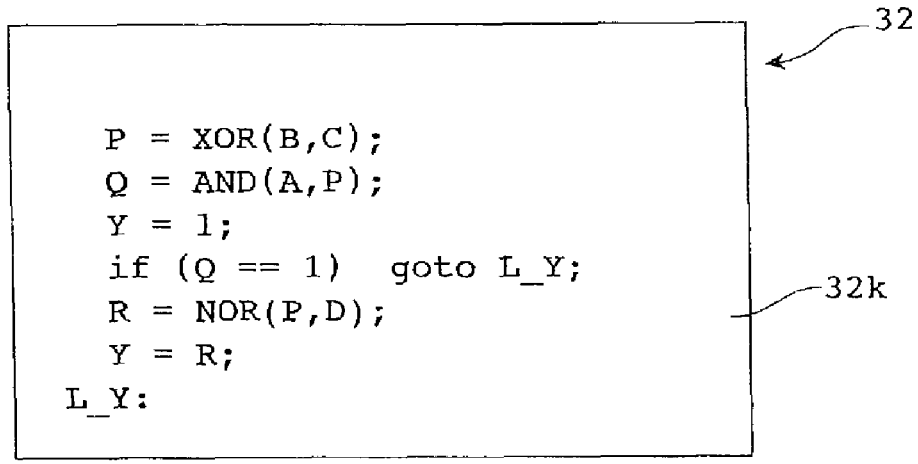
FIG. 23 is a view showing still another example of the simulation program corresponding to the logic circuit shown in FIG. 14.

FIG. 23 shows still another example of a code block of the simulation program 32 of the operation portion 36d. In this code block 32k, like the code block 32j, an operation of a source of the signal P is forcedly executed to obtain a value of the signal P in advance. In addition, since the computed intermediate signal P may be treated like a global input signal, a code to bypass an operation of the generating source of the intermediate signal P is not generated in a scheduling of a subsequent operation.

A template 43 to generate the code block 32j shown in FIG. 22 is incorporated into the routine 48 shown in FIG. 24. This template 43 indicates "generating codes by recursively reconstructing instructions to execute operations of generating sources of all branching intermediate signals" in scheduling. Accordingly, when the operation portion 36d is scheduled by the routine 48, after an operation of a generating source of an intermediate signal is executed, codes are generated so as to bypass a generating source of a don't care input from the output stage to the input stage for remaining operations. In addition, no matter what a dependency relation between intermediate signals is, it is preferable that the template 43 includes an indication to first process an operation of a generating source of an intermediate signal near an input stage and later process an operation of a generating source of an intermediate near an output stage.

Although several methods of preventing overlap of the operation of branching intermediate signals have been illustrated in the above, these methods may be applied alone or in combination to generate a program. For example, it is possible to use a style of the code block 32c shown in FIG. 16 and a style of the code block 32j shown in FIG. 22 in combination. It is possible to generate a code block including a case where an operation of a generating source of an intermediate signal, which is less likely to be completely skipped, is necessarily computed as shown in the code block 32j and operations of generating sources of other intermediate signals are computed while checking every time whether or not computation is completed as shown in the code block 32e. Several methods of inferring a possibility that any operation included in an operation portion as an operation of a generating source of a don't care input is skipped may be considered. One of these methods is a case where a logic of the operation portion is statically analyzed to determine that "there is no possibility of skipping completely". Another method is to accept a heuristic method such as user designation, profiling or the like.

Still another template 45 is incorporated into the routine 48 shown in FIG. 25. This template 45 corresponds to a scheduling of an operation portion having a plurality of global output signals. The template 45 indicates repeatedly scheduling the operation portion by the number of global output signals. Instead of the template 45, according to the same viewpoint, it is possible to construct a template corresponding to a plurality of global output signals based on a template shown in FIG. 17.

That is, in a case where there is no sharing intermediate signal over a plurality of output signals, N completely independent logics are provided. Accordingly, it is possible to apply a template for the above-described one-output logic to each of N logics. In a case where a sharing intermediate signal is present, it is possible to use the routine 48 shown in FIG. 25. When sharing intermediate signals are all obtained by list-up, it is possible to process the remaining logics like the N independent logics with no sharing signal.

The outline of generating the second procedure from the first procedure in consideration of generation of a don't care input has been described based on a combination logic gate in the above. An operation to generate no don't care input, such as a flip-flop, an operation that "a global input signal is only connected to a global output signal (no operation is executed) ", etc., is not required to be reconstructed, and it is possible for those skilled in the art from the above description to provide a template to indicate generation of statements including such operations. In addition, generating (scheduling) the second procedure has been described with reference to C language-like codes (code blocks) in the above. With the reference to the above description, it is possible to generate codes (code blocks) of other languages, such as an assembly language, a machine language and the like without being limited to the C language, and generate contents including these codes, and convert them, without departing from the spirit of the invention.

The invention claimed is:

1. A computer system comprising a storage that stores a first procedure,
    the first procedure including an operation portion for performing multi-stage logical operations from an input stage to an output stage, the operation portion including, between the input stage and the output stage, operations having a plurality of inputs and operations of previous stages as sources of the plurality of inputs; and,
    a generator that generates a second procedure including a plurality of statements for executing the operations included in the operation portion,
    wherein the generator comprises:
    an analyzer that analyzes the operations of the operation portion stored in the storage from the output stage to the input stage and determines whether or not an analyzed operation is a first type of operation in which, as some of the plurality of inputs of the analyzed operation are determined, at least some of other inputs become don't cares; and
    an outputting means that outputs reconstructed statements for executing the analyzed operation if the analyzed operation is the first type of operation, the reconstructed statements including statements for executing one of source operations of inputs of the analyzed operation and for bypassing at least one of the source operations of inputs which becomes don't care by the executing of one of source operations,
    wherein the generator repeats analyzing of the analyzer and outputting of the outputting means, and reconfigures the operation portion of the first procedure from the output stage to the input stage with the reconstructed statements as the second procedure.

2. The computer system according to claim 1,
    wherein the outputting means reconstructs the statement for executing the operation to be analyzed into statements including:

a first statement for executing an operation of a source of a first input which is one of the plurality of inputs of the operation to be analyzed;

a second statement for setting an output of the operation to be analyzed; a third statement for executing an operation of a source of an input which becomes don't care by the first input; and a fourth statement for bypassing the operation of the source of the input when the input becomes don't care by the first input.

3. The computer system according to claim 2, wherein the fourth statement is a statement for bypassing the third statement when the input becomes don't care by the first input.

4. The computer system according to claim 2, wherein the second statement is a statement for setting a prescribed value.

5. The computer system according to claim 1, further having a storage for storing a template including information for reconstructing a statement for executing every kind of operation, some of whose inputs become don't care, into the at least one statement, wherein the outputting means reconstructs the statement for executing the operation to be analyzed into the at least one statement by referring to the template.

6. The computer system according to claim 1, wherein the outputting means reconstructs the statement for executing the operation to be analyzed into the at least one statement when increase of an execution speed of the operation portion is expected by reconstructing the statement for executing the operation to be analyzed.

7. The computer system according to claim 1, wherein the outputting means includes preventing an overlapped output of a statement for executing the same operation.

8. The computer system according to claim 1, further comprising a function as a compiler including a means for generating the second procedure.

9. The computer system according to claim 1, further having:

a means for generating a gate-level netlist from a description of a logic circuit; and a means for generating a program including the second procedure generated based on the first procedure included in the netlist, wherein the means for generating the program includes a means for generating the second procedure.

10. The computer system according to claim 9, further comprising a function as a simulator for executing the program.

11. A system including:

a storage that stores a first procedure comprising an operation portion for performing multi-stage logical operations from an input stage to an output stage, the operation portion including, between the input stage and the output stage, operations having a plurality of inputs and operations of previous stages as sources of the plurality of inputs; and a generator that generates a second procedure including a plurality of statements for executing a plurality of operations included in the operation portion, wherein the generator comprises:

an analyzer that analyzes the operations of the operation portion from the output stage to the input stage and determines whether or not an analyzed operation is a first type of operation in which, as some of the plurality of inputs of the operation of the analyzed operations are determined, at least some of the other inputs become don't care; and a converter that outputs reconstructed statements for executing the analyzed operation if the analyzed operation is the first type of operation, the reconstructed statements include statements for executing one of operation of sources of inputs of the analyzed operation and for bypassing at least one of operation of sources of the inputs which becomes don't care by the executing, and reconfigures the operation portion of the first procedure from the output stage to the input stage with the reconstructed statements as the second procedure.

12. A method including generating a second procedure from a first procedure, the method being implemented in a computer comprising a storage, wherein the first procedure comprises an operation portion for performing logical operations of multi-stage including an input stage and an output stage, the operation portion including, between the input stage and the output stage, operations having a plurality of inputs and operations of previous stages as sources of the plurality of inputs, wherein the second procedure includes a plurality of statements for executing a plurality of operations included in the operation portion, and wherein the generating the second procedure includes the steps of:

(a) analyzing the operations of the operation portion stored in the storage from the output stage to the input stage and determining whether or not an analyzed operation is a first type of operation in which, as some of the plurality of inputs of the analyzed operation are determined, at least some of the other inputs become don't care; and (b) outputting reconstructed statements for executing the analyzed operation if the analyzed operation is the first type of operation, the reconstructed statements including a statements for executing one of operation of sources of inputs of the analyzed operation and for bypassing at least one of operations of sources of the input which becomes don't care by the executing, and reconfiguring the operation portion of the first procedure from the output stage to the input stage with the reconstructed statements as the second procedure.

13. The method according to claim 12, wherein the generating the second procedure includes repeating the step (a) and the step (b), and the reconstructed statement is outputted to the storage in the step (b).

14. The method according to claim 12, wherein the step (b) includes referring to a template comprising information for reconstructing a statement for executing every kind of operation, some of whose inputs become don't care, into the at least one statement.

15. The method according to claim 12, further having the steps of:

generating a gate-level netlist including the first procedure from a description of a logic circuit;

generating a simulation program including the second procedure, including generating the second procedure; and simulating the logic circuit in a cycle base scheme by the simulation program.

* * * * *